(12) United States Patent
Zhang (10) Patent No.: US 10,768,360 B2
(45) Date of Patent: Sep. 8, 2020

(54) BACKLIGHT MODULE AND DISPLAY DEVICE

(71) Applicant: WUHAN TIANMA MICRO-ELECTRONICS CO., LTD., Wuhan (CN)

(72) Inventor: Haoer Zhang, Xiamen (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 18 days.

(21) Appl. No.: 16/174,075

(22) Filed: Oct. 29, 2018

(65) Prior Publication Data

US 2019/0129092 A1 May 2, 2019

(30) Foreign Application Priority Data

Oct. 31, 2017 (CN) .......................... 2017 1 1047457

(51) Int. Cl.
*F21V 8/00* (2006.01)
*H05K 1/18* (2006.01)

(52) U.S. Cl.
CPC .......... *G02B 6/0088* (2013.01); *G02B 6/0091* (2013.01); *G02B 6/0093* (2013.01); *H05K 1/189* (2013.01); *G02B 6/009* (2013.01); *H05K 2201/10121* (2013.01)

(58) Field of Classification Search
CPC .. G02B 6/0088; G02B 6/0091; G02B 6/0093; G02B 6/009; H05K 1/189; H05K 2201/10121; G02F 1/133615
See application file for complete search history.

(56) References Cited

U.S. PATENT DOCUMENTS

| | | | | |
|---|---|---|---|---|
| 5,803,573 A | * | 9/1998 | Osawa ................... | G01D 11/28 362/612 |
| 2006/0012731 A1 | * | 1/2006 | Ishiwa ................. | G02B 6/0091 349/65 |
| 2008/0186430 A1 | * | 8/2008 | Seo ....................... | G02B 6/0088 349/65 |
| 2012/0257122 A1 | * | 10/2012 | Suzuki ................ | G02B 6/0088 348/794 |

(Continued)

FOREIGN PATENT DOCUMENTS

| CN | 102679243 A | 9/2012 |
|---|---|---|
| CN | 103148408 A | 6/2013 |

(Continued)

*Primary Examiner* — Erin Kryukova
(74) *Attorney, Agent, or Firm* — Alston & Bird LLP (57) ABSTRACT

A backlight module and a display device are provided. The backlight module includes a frame, a flexible circuit board, a light guide plate, and multiple light emitting units. The frame includes opposite first and second borders, and opposite third and fourth borders. The multiple light emitting units are fixed on the flexible circuit board. The flexible circuit board is located inside the frame and is close to the first border. There is a first gap between the light emitting unit closest to the third border and the third border, and between the light emitting unit closest to the fourth border and the fourth border. The light guide plate is fixed to the flexible circuit board. The light guide plate includes a light guide plate body and two spacers. Each of the two spacers is located in the first gap and is bonded to the frame.

11 Claims, 8 Drawing Sheets

(56) References Cited

U.S. PATENT DOCUMENTS

| | | | | |
|---|---|---|---|---|
| 2012/0287371 | A1* | 11/2012 | Oura | G02F 1/133615 |
| | | | | 349/60 |
| 2012/0327684 | A1* | 12/2012 | Isobe | G02B 6/0021 |
| | | | | 362/602 |
| 2015/0029443 | A1* | 1/2015 | Inui | G02F 1/133308 |
| | | | | 349/65 |
| 2015/0146109 | A1* | 5/2015 | Kasai | G02B 6/0088 |
| | | | | 348/790 |
| 2016/0139330 | A1* | 5/2016 | Kawabata | F21V 15/012 |
| | | | | 362/611 |
| 2017/0343721 | A1* | 11/2017 | Takada | G02B 6/0013 |
| 2018/0120643 | A1* | 5/2018 | Watanabe | F21S 2/005 |
| 2018/0210143 | A1* | 7/2018 | Miyazaki | G02F 1/133615 |

FOREIGN PATENT DOCUMENTS

| | | |
|---|---|---|
| CN | 104421770 A | 3/2015 |
| CN | 204943151 U | 1/2016 |
| CN | 205247016 U | 5/2016 |
| CN | 107620880 A | 1/2018 |

\* cited by examiner

BACKLIGHT MODULE AND DISPLAY DEVICE

CROSS REFERENCE TO RELATED APPLICATION

The present application claims priority to Chinese Patent Application No. CN201711047457.8, titled "BACKLIGHT MODULE AND DISPLAY DEVICE", filed on Oct. 31, 2017 with the Chinese Patent Office, which is incorporated herein by reference in its entirety.

FIELD

The present disclosure relates to the technical field of display, and in particular to a backlight display module and a display device.

BACKGROUND

With the continuous development of the display technology, people have higher requirements for the display effect of a display panel. Increasing the screen-to-body ratio is an important way to improve the display effect of the display panel. Therefore, a narrow border on the display module is required for the display panel.

In order to make the narrow border, an integrated circuit chip is provided on a flexible circuit board, i.e., the chip-on-Flex (COF) technology, by which the bonding region between the border and the integrated circuit chip is decreased, so that the width of the lower border of the display panel is half of that the conventional module or even less, which significantly narrows the width of the border, while the lower border of the backlight module is also narrowed.

In order to adapt to the narrowed lower border of the backlight module, the size of the flexible circuit board connected to the light emitting unit is correspondingly decreased, which reduced the bonding area between the flexible circuit board and the light guide plate to less than half of the conventional module. As a result, the light guide plate is easily misplaced or even detached from falling, affecting display effect of the display panel or even causing failure in display, reducing the durability of the backlight module and the display panel, and decreasing the service life of the display panel.

Therefore, it is desired to provide a backlight module and a display device, to solve the above problems.

SUMMARY

In order to solve the problems descried in the background, there are provided a backlight module and a display device in the present disclosure, which can enhance the fixing strength of the light guide plate, thereby improving the durability of the backlight module and the display device.

The backlight module provided in the present disclosure includes a frame, a flexible circuit board, a light guide plate, and multiple light emitting units. The frame includes a first border and a second border opposite to each other, and a third border and a fourth border opposite to each other. Both the third border and the fourth border are adjacent to the first border and the second border. The multiple light emitting units are fixed on the flexible circuit board. The flexible circuit board is located inside the frame and is close to the first border. The light emitting unit closest to the third border is a first light emitting unit, and the light emitting unit closest to the fourth border is a second light emitting unit. There is a first gap between the first light emitting unit and the third border, and between the second light emitting unit and the fourth border. The light guide plate is located inside the frame and on a side of the flexible circuit board away from the first border and is fixed to a surface of the flexible circuit board to which the light emitting units are fixed. The light guide plate includes a light guide plate body and two spacers. The two spacers are located at an end of the light guide plate body close to the first border and extend in a direction away from the light guide plate body. Each of the two spacers is located in the first gap and is bonded to the frame.

The display device provided in the present disclosure includes the backlight module described above.

As compared with the conventional technology, the backlight module and the display device provided in the present disclosure have the following beneficial effects.

In the backlight module and the display device provided in the present disclosure, two spacers are provided on the light guide plate body, and the spacers are fixed to the frame while the light guide plate body is bonded to the flexible circuit board, which significantly enhances the fixing strength of the light guide plate, thereby improving the durability of the backlight module and the entire display device.

Other features and advantages of the present disclosure are clear from the following detailed description of exemplary embodiments of the present disclosure made with reference to the drawings.

BRIEF DESCRIPTION OF THE DRAWINGS

The drawings that are incorporated in this specification and form a part of this specification, show embodiments of the present disclosure, and explain principles of the present disclosure together with the description thereof.

DETAILED DESCRIPTION OF EMBODIMENTS

Exemplary embodiments of the present disclosure are described below in detail with reference to the drawings. It should be noted that, unless otherwise specified, the relative arrangement of the components and steps, numerical expressions and numerical values set forth in the embodiments are not intended to limit the scope of the present disclosure.

The following description of at least one exemplary embodiment is merely illustrative, and is not intended to limit the technical solution, and applications or uses of the technical solution.

Technologies, methods and devices known to those skilled in the art may not be described in detail, which should be considered as a part of this specification where appropriate.

In all examples shown and discussed herein, any specific values should be construed as being merely illustrative and not limitative. Therefore, different values may be used in other examples of the exemplary embodiments.

It should be noted that similar reference numerals and letters indicate similar items in the drawings. Therefore, once an item is defined in one of the drawings, it is not discussed in the subsequent drawings.

Figure 1:
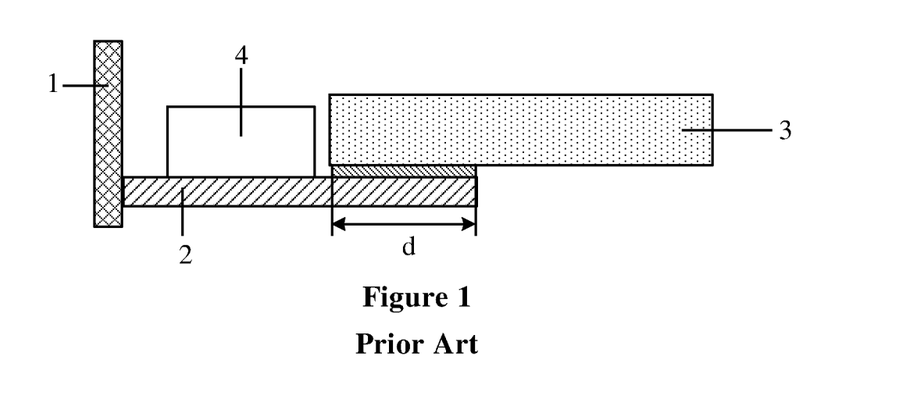
FIG. 1 is a partial cross sectional view of a backlight module in the conventional technology.

FIG. 1 is a partial cross sectional view of a backlight module in the conventional technology. Referring to FIG. 1, in order to narrow down a border 1, a width of a flexible circuit board 2 connected to a light emitting unit 4 is decreased, which results in a decreased bonding width d of a light guide plate 3 with the flexible circuit board 2, thereby reducing the fixing strength of the light guide plate 3 with the flexible circuit board 2. In this case, the light guide plate 3 is easily displaced or even detached due to the falling of the display device, affecting the display effect of the display panel or causing failure in display.

In order to solve the above problems, a backlight module is provided in the present disclosure, to enhance the fixing strength of the light guide plate. The display module is described below with reference to the drawings.

Figure 2:
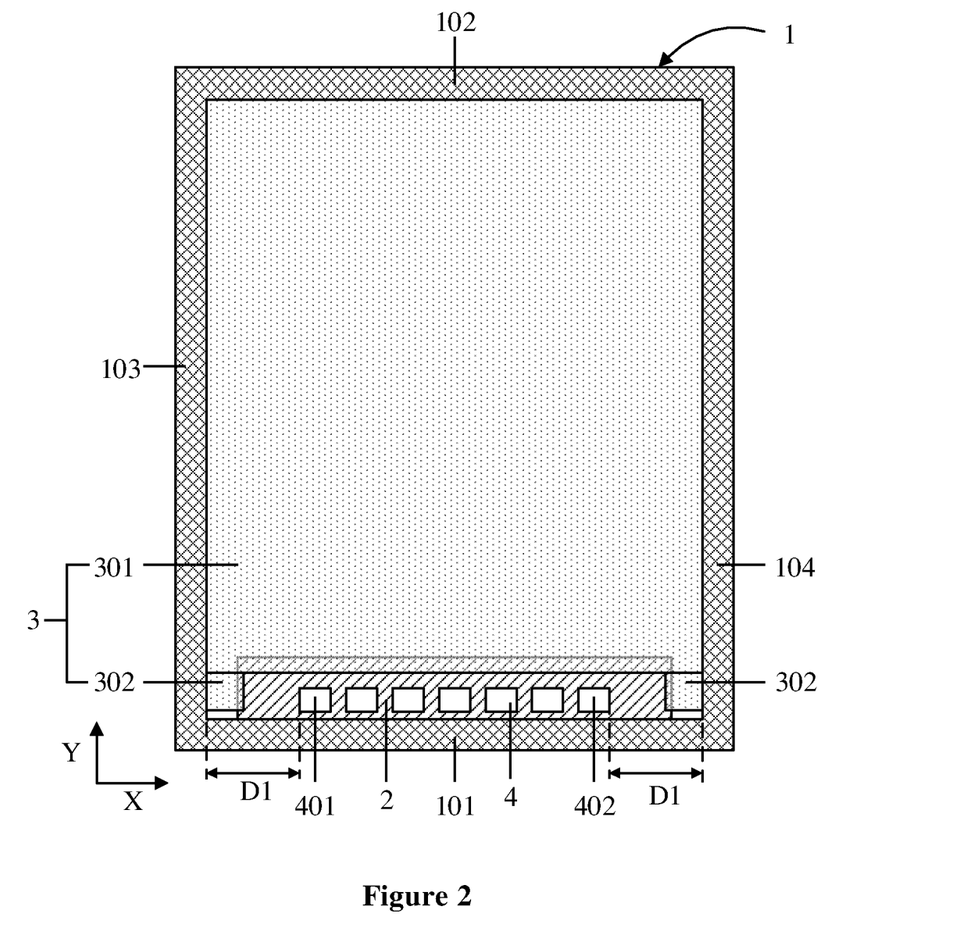
FIG. 2 is a schematic top view of a backlight module according to an embodiment of the present disclosure.

FIG. 2 is a schematic top view of a backlight module according to an embodiment of the present disclosure. Referring to FIG. 2, the backlight module includes: a frame 1, a flexible circuit board 2, a light guide plate 3, and multiple light emitting units 4.

The frame 1 includes a first border 101 and a second border 102 opposite to each other, and a third border 103 and a fourth border 104 opposite to each other. Both the third border 103 and the fourth border 104 are adjacent to the first border 101 and the second border 102. The multiple light emitting units 4 are fixed on the flexible circuit board 2. The flexible circuit board 2 is located inside the frame 1 and is close to the first border 101. The light emitting unit 4 closest to the third border 103 is a first light emitting unit 401, and the light emitting unit 4 closest to the fourth border 104 is a second light emitting unit 402. There is a first gap D1 between the first light emitting unit 401 and the third border 103, and between the second light emitting unit 402 and the fourth border 104. The light guide plate 3 is located inside the frame 1 and on a side of the flexible circuit board 2 away from the first border 101 and is fixed to a surface of the flexible circuit board 2 to which the light emitting units 4 are fixed. The light guide plate 3 includes a light guide plate body 301 and two spacers 302. The two spacers 302 are located at an end of the light guide plate body 301 close to the first border 101 and extend in a direction away from the light guide plate body 301. Each of the two spacers 302 is located in the first gap D1 and is bonded to the frame 1.

In the backlight module according to this embodiment, the two spacers are provided on the light guide plate body, and the spacers are fixed to the frame while the light guide plate body is bonded to the flexible circuit board, which significantly enhances the fixing strength of the light guide plate, thereby improving the durability of the backlight module and the display device.

Referring to FIG. 2, the spacer 302 may be a rectangular bump or a trapezoidal bump, but is not limited thereto, as long as the spacer 302 can be provided in the first gap D1 and can be easily bonded to the frame 1.

Figure 3:
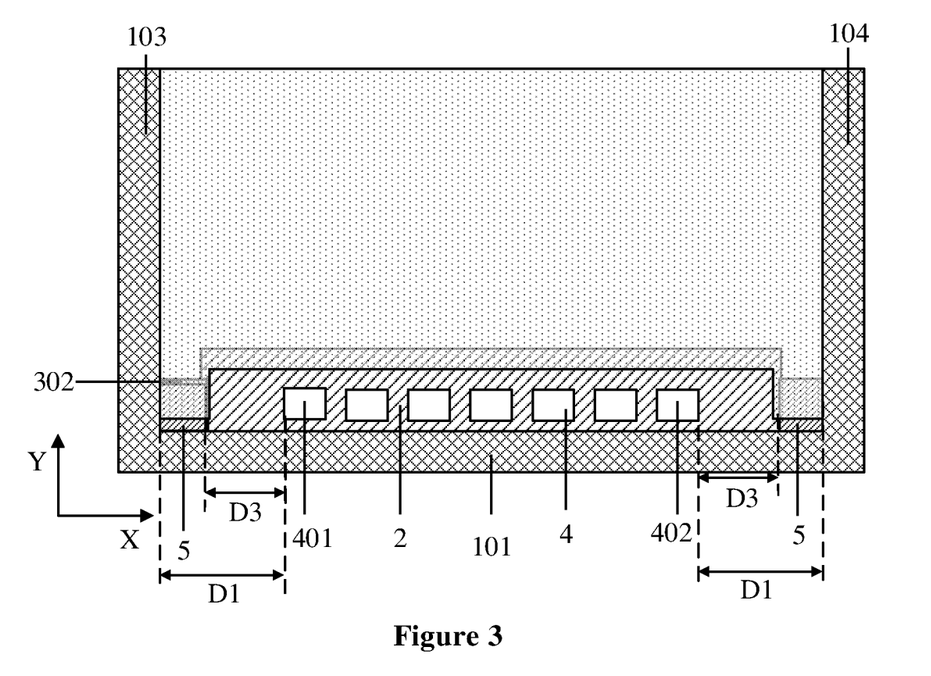
FIG. 3 is a partial top view of a backlight module according to an embodiment of the present disclosure.

FIG. 3 is a partial top view of a backlight module according to an embodiment of the present disclosure. Referring to FIG. 3, the light guide plate and the frame may be bonded by an adhesive 5. The adhesive 5 in the present disclosure is glue or double-sided adhesive tape, by which the bonding process is simple and is easily implemented. In some implementations, the glue may be a hot melt adhesive. There is a third gap D3 between the hot melt adhesive close to the third border 103 and the first light emitting unit 401, and between the hot melt adhesive close to the fourth border 104 and the second light emitting unit 402. With the third gap D3, the influence of the high temperature of the hot melt adhesive on the light emitting unit in the dispensing process can be reduced. In order to further reduce the influence of the high temperature of the hot melt adhesive on the light emitting unit 4 in the dispensing process, the hot melt adhesive having the dispensing temperature ranging from 50° C. to 100° C. is chosen, and the hot melt adhesive may be dispensed once or multiple times according to specific requirements.

Figure 4:
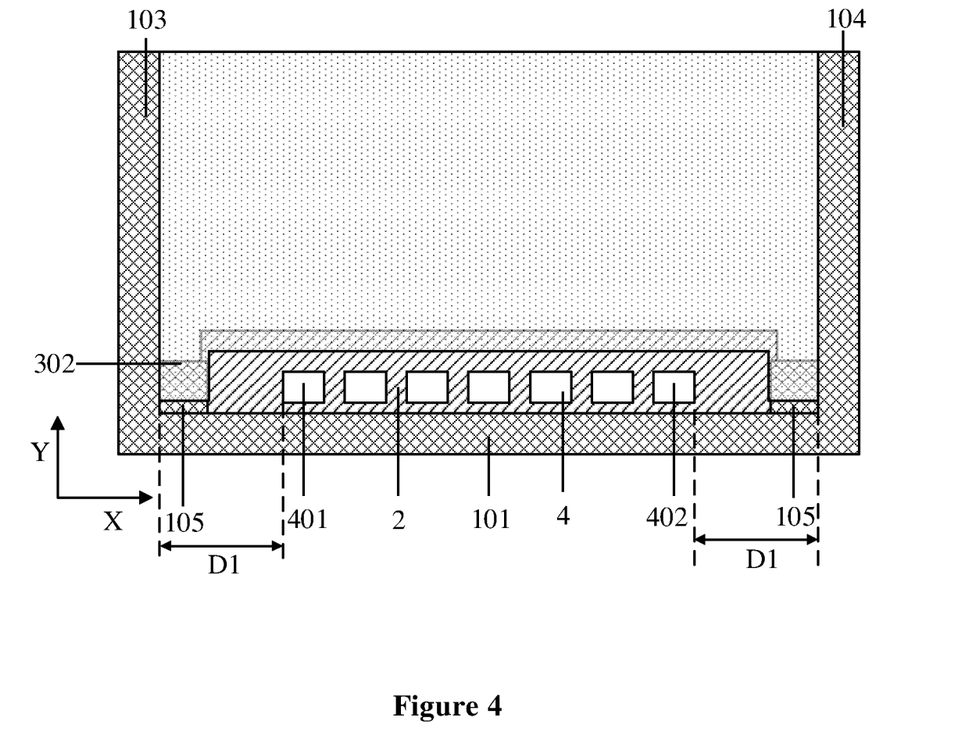
FIG. 4 is a schematic top view of another backlight module according to an embodiment of the present disclosure.

FIG. 4 is a schematic top view of another backlight module according to an embodiment of the present disclosure. Referring to FIG. 4, inside the frame 1, two latches 105 are respectively provided at a junction between the third border 103 and the first border 101 and a junction between the fourth border 104 and the first border 101. Each of the two latches 105 is located in the first gap D1 and is bonded to one of the two spacers 302. The design of the latch is more suitable for the frame with no bottom plate. With the latch, the fixing strength of the light guide plate with the frame is further enhanced, as compared with the case that the spacer is only bonded to the frame.

Figure 5:
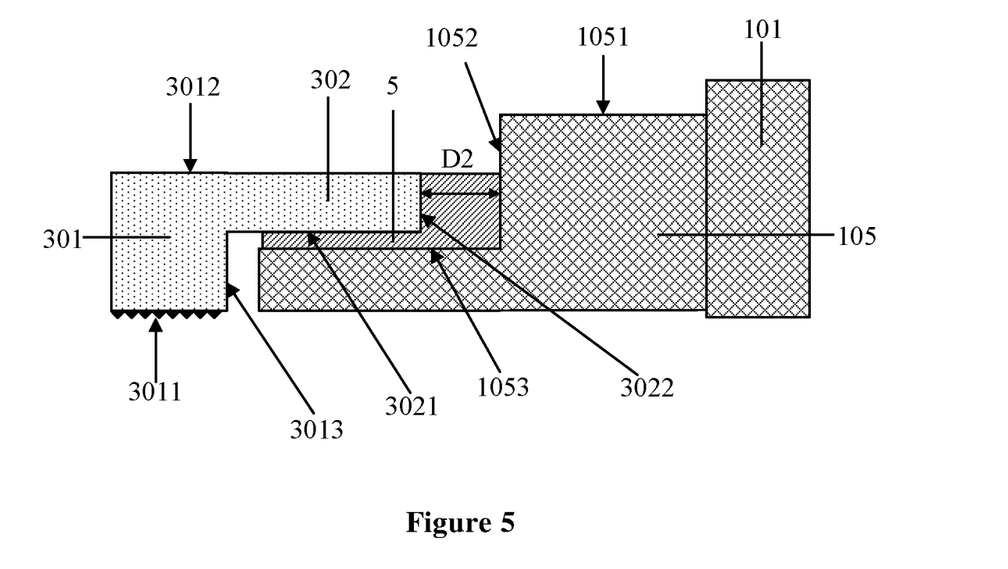
FIG. 5 is a schematic side view showing a bonding structure for a spacer and a latch according to an embodiment of the present disclosure.

FIG. 5 is a schematic side view showing a bonding structure for a spacer and a latch according to an embodiment of the present disclosure. Referring to FIG. 5, the light guide plate body 301 includes a mesh surface 3011, a smooth surface 3012, and a light incident end surface 3013 connected to the mesh surface 3011 and the smooth surface 3012. The light incident end surface 3013 is a surface of the light guide plate body 301 close to the first border 101. Each of the spacers 302 forms a first step structure with the light guide plate body 301. The mesh surface 3011 is a step surface of the first step structure, the light incident end surface 3013 is a step side surface of the first step structure, a first surface 3021 of the spacer is a step bottom surface of the first step structure, and a second surface 3022 of the spacer is away from the light incident end surface 3013. The latch 105 forms a second step structure. A step bottom surface 1053 of the second step structure is opposite to the first surface 3021, and a step side surface 1052 of the second step structure is opposite to the second surface 3022. There is a second gap D2 between the step side surface 1052 of the second step structure and the second surface 3022. In a direction perpendicular to the mesh surface 3011, a step surface 1051 of the second step structure, among all the surfaces of the second step structure, has the largest distance to the mesh surface 3011. The first surface 3021 and the step bottom surface 1053 of the second step structure are bonded to each other by the adhesive 5, and the second surface 3022 and the step side surface 1052 of the second step structure are bonded to each other by the adhesive 5. By designing the spacer and the latch as the matching step structures, the bonding area between the spacer and the latch are increased, further enhancing the fixing strength of the light guide plate with the frame.

Figure 6:
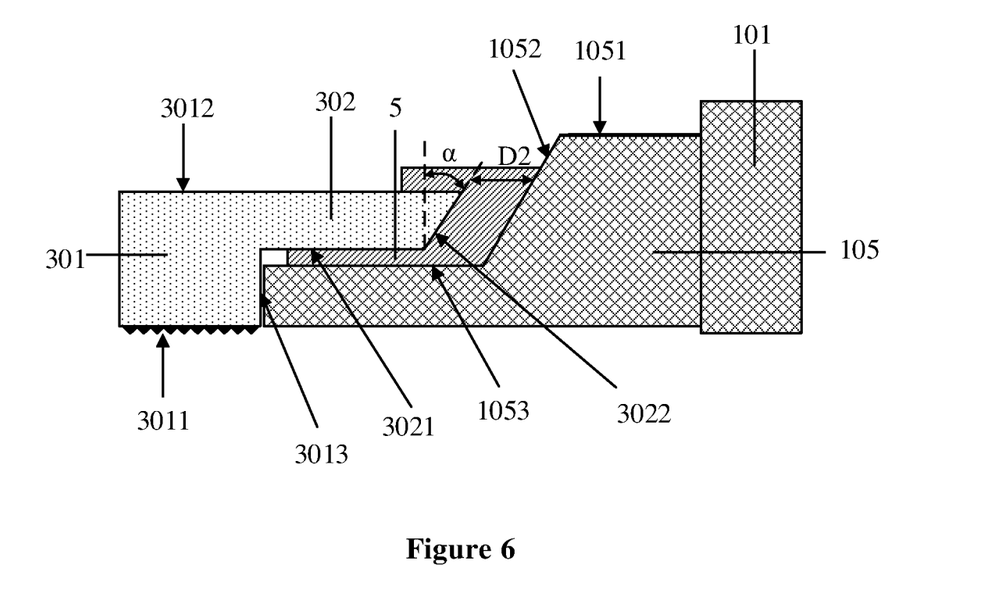
FIG. 6 is a schematic side view showing another bonding structure for a spacer and a latch according to an embodiment of the present disclosure.

FIG. 6 is a schematic side view showing another bonding structure for a spacer and a latch according to an embodiment of the present disclosure. Referring to FIG. 6, the step side surface 1052 of the second step structure is parallel to the second surface 3022, and an angle α between the second surface 3022 and a plane where the light incident end surface 3013 is located (the dotted line in FIG. 6 is parallel to the light incident end surface) ranges from 30° to 60°. With this design, the bonding area of the second surface with the step side surface of the second step structure is increased, which enhances the fixing strength of the light guide plate with the frame. In addition, in a case that the adhesive 5 is glue, the glue can easily flow into the space between the first surface and the step bottom surface of the second step structure along the inclined step side surface of the second step structure, thereby reducing the difficulty of the dispensing process.

Figure 7:
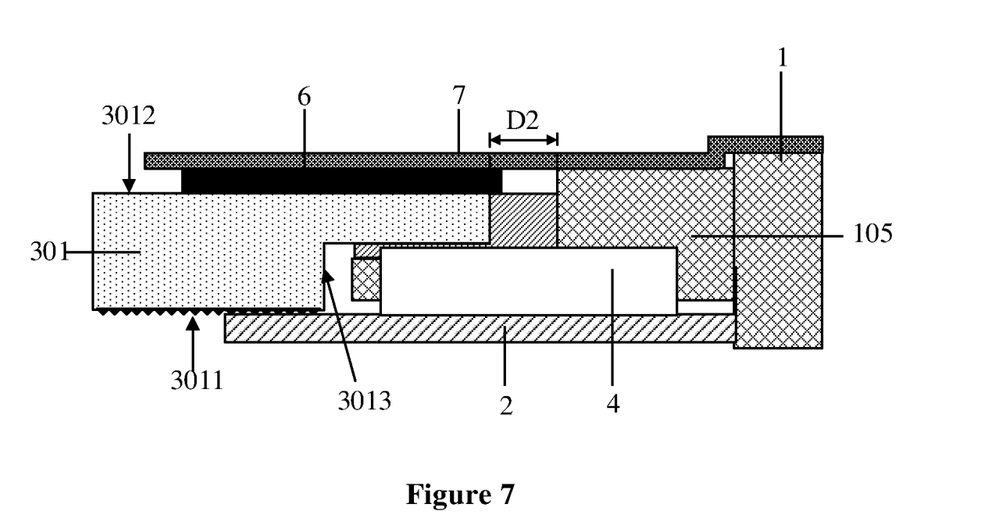
FIG. 7 is a partial cross sectional view of a backlight module according to an embodiment of the present disclosure.

FIG. 7 is a partial cross sectional view of a backlight module according to an embodiment of the present disclosure. Referring to FIG. 7, since an illumination angle of the light emitting unit 4 on a plane parallel to the bottom plate 106 is less than 180°, a light source blind spot exists between adjacent light emitting units 4, and an alternating dark and light region exists on a side of the light emitting unit 4 away from the first border 101, that is, a firefly phenomenon occurs. In order to suppress the firefly phenomenon, a light shielding strip 6 and a light shielding adhesive tape 7 are provided on a side of the smooth surface 3012 away from the flexible circuit board 2. The light shielding strip 6 is located between the light guide plate body 301 and the light shielding adhesive tape. An orthographic projection of the light incident end surface 3013 on the smooth surface 3012 is in an orthographic projection of the light shielding strip 6 on the smooth surface 3012. An orthographic projection of the light shielding adhesive tape 7 on the smooth surface 3012 covers orthographic projections of the light emitting units 4 and the orthographic projection of the light shielding strip 6 on the smooth surface 3012. The light shielding adhesive tape 7 is fixed to the frame 1. The light shielding strip 6 is generally made of black polyethylene terephthalate (PET), but is not limited thereto.

Figure 8:
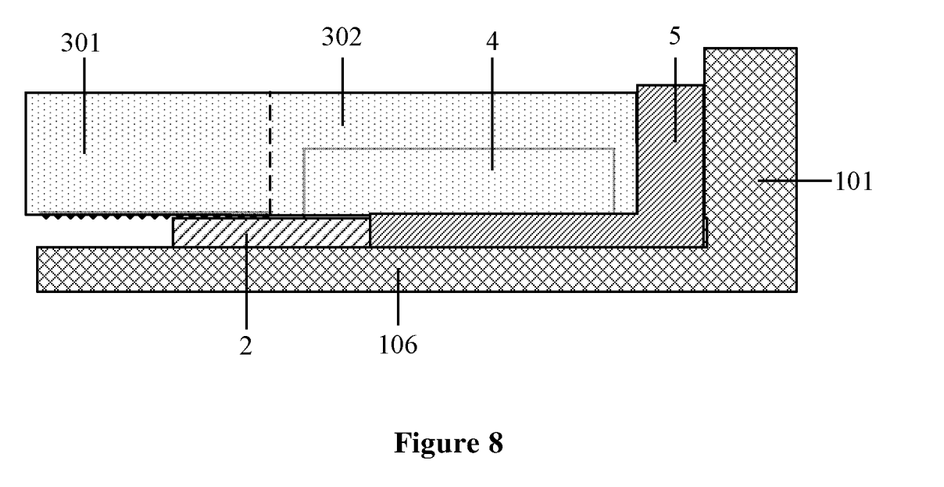
FIG. 8 is a partial cross sectional view of another backlight module according to an embodiment of the present disclosure.

FIG. 8 is a partial cross sectional view of another backlight module according to an embodiment of the present disclosure. Referring to FIG. 8, the frame 1 further includes a bottom plate 106. The bottom plate 106 is surrounded by the first border 101, the second border 102, the third border 103, and the fourth border 104. The spacers 302 are fixed to the bottom plate 106 by the adhesive 5. The spacers 302 may also be bonded to the frame in this case.

Still referring to FIG. 8, the light emitting units 4 are fixed to a surface of the flexible circuit board 2 away from the bottom plate 106. As compared with the conventional backlight module structure adopting the COF technology in which the light emitting unit is provided on a side of the flexible circuit board close to the bottom plate, the backlight source is mounted backward in this design, which decreases a distance between the light shielding strip and the light emitting unit in a direction perpendicular to the bottom plate, so that the light shading strip has a better light shading effect while meeting the design requirements for the narrow border, thereby suppressing or even avoiding the firefly phenomenon.

Figure 9:
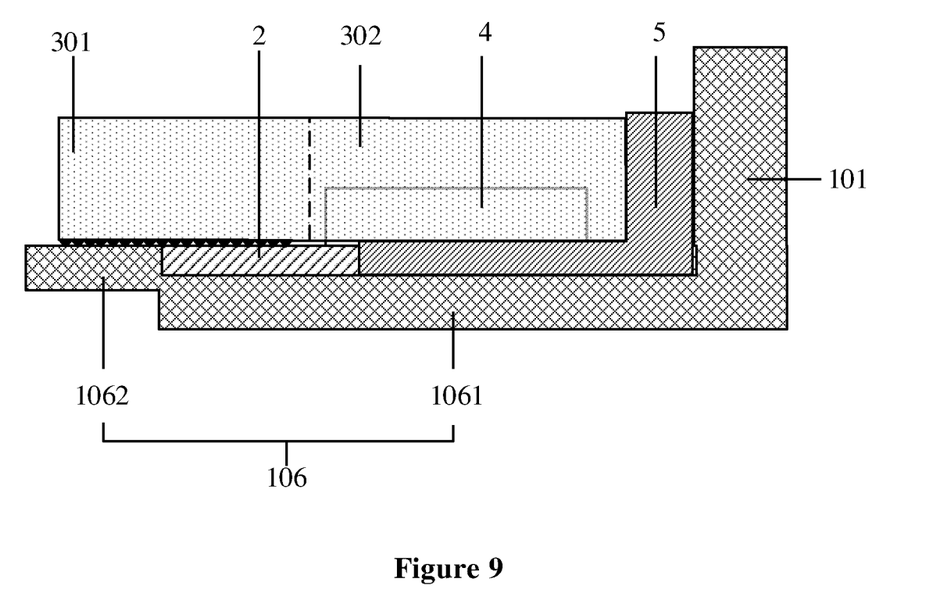
FIG. 9 is a partial cross sectional view of another backlight module according to an embodiment of the present disclosure.

It can be seen from FIG. 8 that there is a gap between the light guide plate body 301 and the bottom plate 106, which is resulted from the fact that the light guide plate body 301 is located on the side of the flexible circuit board 2 away from the bottom plate 106. In order to remove the gap, another backlight module is provided in the present disclosure. FIG. 9 is a partial cross sectional view of another backlight module according to an embodiment of the present disclosure. Referring to FIG. 9, the bottom plate 106 includes a first region 1061 and a second region 1062. In a direction perpendicular to the bottom plate 106, a distance between the first region 1061 and the light guide plate 3 is greater than a distance between the second region 1062 and the light guide plate 3. An orthographic projection of the flexible circuit board 2 on the bottom plate 106 is in the first region 1061. The bottom plate 106 close to the first border 101 is partially sunk (that is, the first region 1061 is sunk). In the direction perpendicular to the bottom plate 106, a depth of the first region 1061 being sunk is equal to a thickness of the flexible circuit board 2, so that the light guide plate body 301 is in contact with the bottom plate 106, which not only facilitates the thinning of the backlight module, but also enhances the fixing strength of the light guide plate 3 with the frame.

Figure 10:
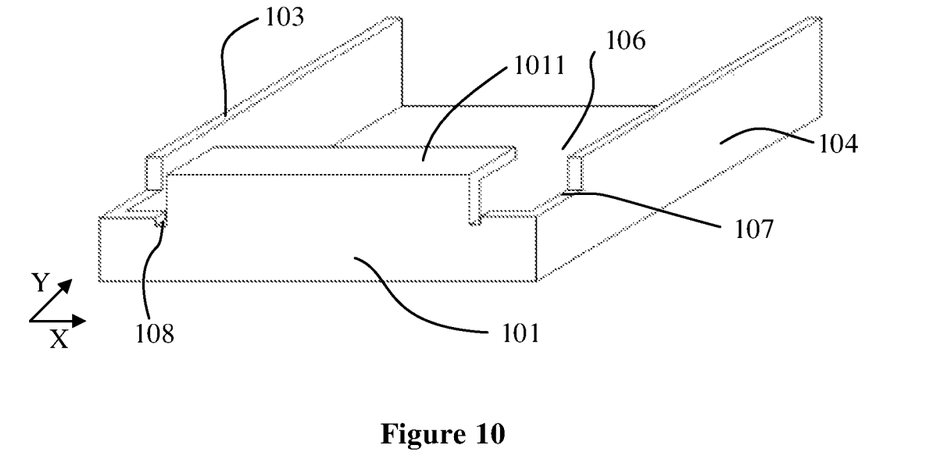
FIG. 10 is a partial perspective view of a frame of a backlight module according to an embodiment of the present disclosure.

FIG. 10 is a partial structural view of a frame of a backlight module according to an embodiment of the present disclosure. Referring to FIG. 10, the junction between the first border 101 and the third border 103, and the junction between the first border 101 and the fourth border 104 are respectively recessed towards the bottom plate 106 to form two notches 107. A relief 108 recessed towards the bottom plate 106 is formed at an end of each of the two notches 107 close to the first border 101. A first direction X is an extending direction of the first border, and a second direction Y is perpendicular to the first direction. A length of the notch 107 in the first direction X is less than a length of the first gap in the first direction X, and a length of the notch 107 in the second direction Y is less than a length of the first gap in the second direction Y. The length of the first gap in the second direction Y refers to a distance between the first border and the light guide plate body in the second direction Y. The first border 101 includes an extending portion 1011 extending towards the inside of the frame. The extending portion 1011 is located at a position other than the notch 107 on a side of the first border 101 away from the bottom plate 106. By providing the notch, the stresses at the junction between the first border and the third border and at the junction between the first border and the fourth border can be reduced, thereby preventing the junctions from deforming and breaking due to the stresses. In order to further reduce the stresses at the junction between the first border and the third border and at the junction between the first border and the fourth border, the relief is formed at a position where each of the notches is connected to the first border. The relief includes, but is not limited to, a rectangular groove and an arc-shaped groove. The extending portion is provided to increase the fixing area of the light shielding adhesive tape with the frame, so as to enhance the fixing strength.

Figure 11:
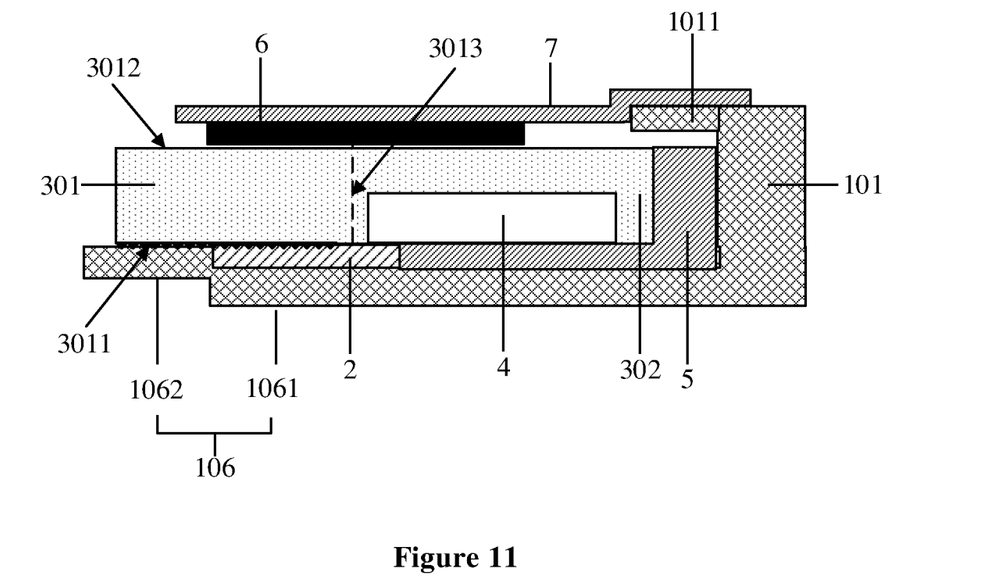
FIG. 11 is a partial cross sectional view of a backlight module according to an embodiment of the present disclosure.

FIG. 11 is a partial cross sectional view of a backlight module according to an embodiment of the present disclosure. Referring to FIG. 11, in order to suppress the firefly phenomenon, a light shielding strip 6 and a light shielding adhesive tape 7 are provided on a side of the smooth surface 3012 away from the flexible circuit board 2, and the light shielding strip 6 is located between the light guide plate body 301 and the light shielding adhesive tape 7. An orthographic projection of the light incident end surface 3013 on the smooth surface 3012 is in an orthographic projection of the light shielding strip 6 on the smooth surface 3012. An orthographic projection of the light shielding adhesive tape 7 on the bottom plate 106 covers orthographic projections of the light emitting units 4 and the light shielding strip 6 on the bottom plate 106. The light shielding adhesive tape 7 is fixed to a surface of the extending portion 1011 away from the bottom plate 106. By providing the light shielding strip 6 and the light shielding adhesive tape 7, the alternating dark and light region on the side of the light emitting unit 4 away from the first border 101 can be shielded, thereby improving the display effect.

Figure 12:
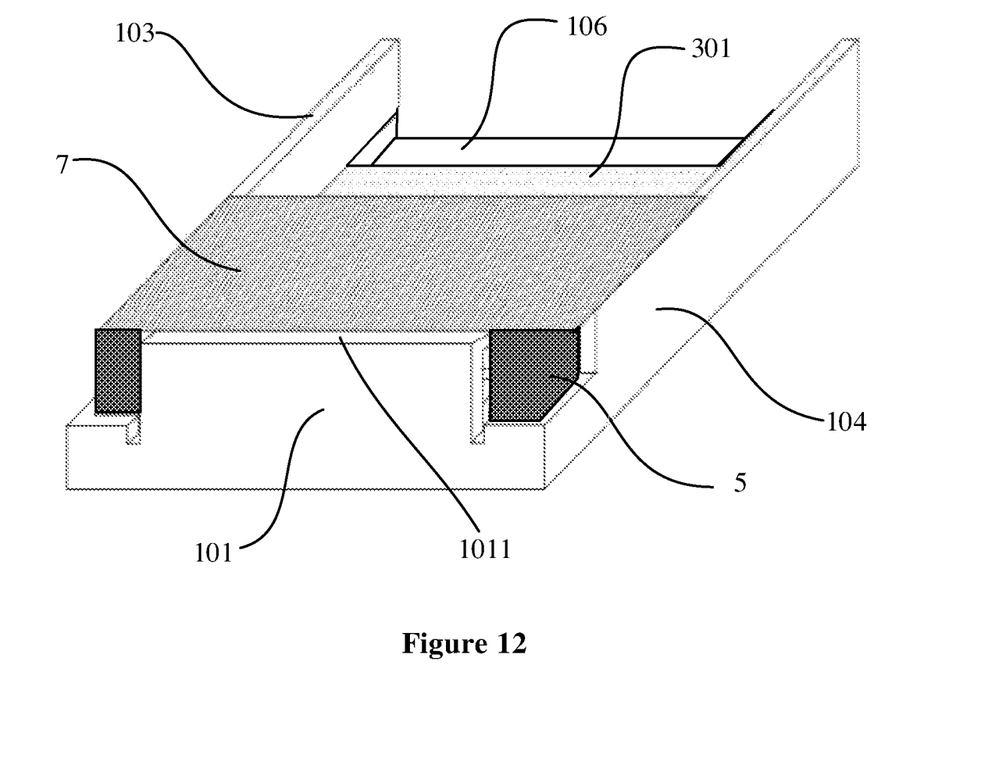
FIG. 12 is a perspective view of a backlight module according to an embodiment of the present disclosure.

FIG. 12 is a partial schematic view of a backlight module according to an embodiment of the present disclosure. Referring to FIG. 12, the spacers (which are not shown in FIG. 12) are fixed to the frame by an adhesive 5. The adhesive 5 is glue. In a direction perpendicular to the bottom plate 106, a distance between a surface of the glue away from the bottom plate 106 and the bottom plate 106 is equal to a distance between a surface of the extending portion 1011 away from the bottom plate 106 and the bottom plate 106. In this way, a thickness of the glue is determined, so that the fixing strength of the spacer with the frame is enhanced, and the surface of the glue away from the bottom plate 106 is in contact with the light shielding adhesive tape 7 to prevent the light shielding adhesive tape 7 at the notch from being suspended, thereby enhancing the fixing strength of the light shielding adhesive tape 7, and suppressing the light leakage at the notch.

Figure 13:
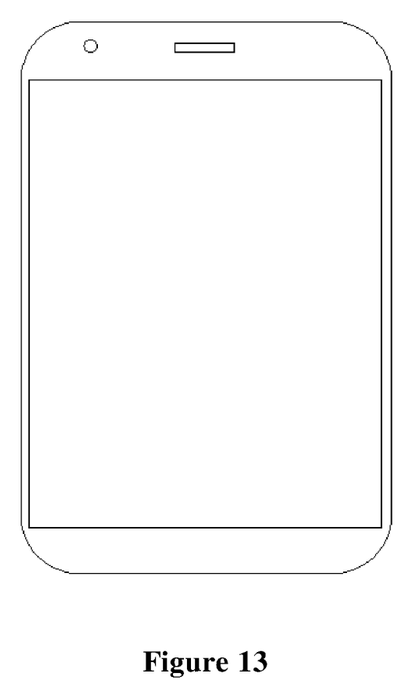
FIG. 13 is a schematic top view of a display device according to an embodiment of the present disclosure.

In order to solve the above technical problems, a display device is further provided in the present disclosure. FIG. 13 is a schematic top view of a display device according to an embodiment of the present disclosure. Referring to FIG. 13, the display device includes any one of the backlight modules in the above embodiments. In the display device according to this embodiment, two spacers are provided on the light guide plate body, and the spacers are fixed to the frame while the light guide plate body is bonded to the flexible circuit board, which significantly enhances the fixing strength of the light guide plate.

As compared with the conventional technology, the backlight module and the display device provided in the present disclosure have the following beneficial effects.

In the backlight module and the display device provided in the present disclosure, two spacers are provided on the light guide plate body, and the spacers are fixed to the frame while the light guide plate body is bonded to the flexible circuit board, which significantly enhances the fixing strength of the light guide plate, thereby improving the durability of the backlight module and the display device.

While some specific embodiments of the present disclosure have been described in detail by examples, it should be understood by those skilled in the art that, the above examples are merely illustrative and are not intended to limit the scope of the present disclosure. Those skilled in the art may make modifications to the above embodiments without departing from the scope and spirit of the present disclosure. The scope of the present disclosure is defined by the appended claims.

What is claimed is:
1. A backlight module, comprising:
a frame, comprising a first border and a second border opposite to each other, and a third border and a fourth border opposite to each other, wherein both the third border and the fourth border are adjacent to the first border and the second border respectively;
a flexible circuit board located inside the frame and is close to the first border;
a light guide plate, comprising a light guide plate body and two spacers, wherein the two spacers are located at an end of the light guide plate body close to the first border and extend in a direction away from the light guide plate body; and
a plurality of light emitting units fixed on the flexible circuit board,
wherein a first light emitting unit among the plurality of light emitting units is closest to the third border, and a second light emitting unit among the plurality of light emitting units is closest to the fourth border;
wherein one first gap is placed between the first light emitting unit and the third border, and another first gap is placed between the second light emitting unit and the fourth border;
wherein the light guide plate is located inside the frame on a side of the flexible circuit board away from the first border, and wherein the two spacers are each located in one of the first gaps, and
wherein inside the frame, two latches are respectively provided at a junction between the third border and the first border and a junction between the fourth border and the first border, and each of the two latches is located in one of the first gaps and is bonded to one of the two spacers.

2. The backlight module according to claim 1,
wherein the light guide plate body comprises a non-smooth surface, a smooth surface, and a light incident end surface connected to the non-smooth surface and the smooth surface, the light incident end surface is a surface of the light guide plate body close to the first border, wherein the non-smooth surface is configured to comprise mesh-like structures;
wherein the two spacers each forms a first step structure with the light guide plate body, the non-smooth surface is a step surface of the first step structure, the light incident end surface is a step side surface of the first step structure, a first surface of the spacer is a step bottom surface of the first step structure, and a second surface of the spacer is away from the light incident end surface;
wherein each of the latches forms a second step structure, a step bottom surface of the second step structure is opposite to the first surface of the spacer, a step side surface of the second step structure is opposite to the second surface of the spacer, and there is a second gap between the step side surface of the second step structure and the second surface of the spacer; and
wherein in a direction perpendicular to the non-smooth surface, a step surface of the second step structure, among all the surfaces of the second step structure, has the largest distance to the non-smooth surface.

3. The backlight module according to claim 2, wherein the step side surface of the second step structure is parallel to the second surface of the spacer, and an angle between the second surface of said spacer and a plane, where the light incident end surface is located, ranges from 30° to 60°.

4. The backlight module according to claim 2,
wherein a light shielding strip and a light shielding adhesive tape are provided on a side of the smooth surface away from the flexible circuit board, the light shielding strip being between the light guide plate body and the light shielding adhesive tape;
wherein an orthographic projection of the light incident end surface on the smooth surface is in an orthographic projection of the light shielding strip on the smooth surface; and
wherein an orthographic projection of the light shielding adhesive tape on the smooth surface covers orthographic projections of the plurality of light emitting units, and the orthographic projection of the light shielding strip on the smooth surface; and
wherein the light shielding adhesive tape is fixed to the frame.

5. The backlight module according to claim 1,
wherein the spacers are fixed to the frame by a glue, and the glue is a hot melt adhesive; and
wherein a third gap is formed between the hot melt adhesive close to the third border and the first light emitting unit, and also formed between the hot melt adhesive close to the fourth border and the second light emitting unit.

6. The backlight module according to claim 5, wherein a dispensing temperature of the hot melt adhesive ranges from 50° C. to 100° C., and the hot melt adhesive is dispensed once or multiple times.

7. The backlight module according to claim 1, wherein at least one of the spacers is a rectangular bump.

8. A display device, comprising a backlight module, wherein the backlight module comprises:
a frame, comprising a first border and a second border opposite to each other, and a third border and a fourth border opposite to each other, wherein both the third border and the fourth border are adjacent to the first border and the second border;
a flexible circuit board located inside the frame and is close to the first border;
a light guide plate, comprising a light guide plate body and two spacers, wherein the two spacers are located at an end of the light guide plate body close to the first border and extend in a direction away from the light guide plate body; and
a plurality of light emitting units fixed on the flexible circuit board;
wherein a first light emitting unit among the plurality of light emitting units is closest to the third border, and a second light emitting unit among the plurality of light emitting units is closest to the fourth border, wherein one first gap is formed between the first light emitting unit and the third border, and wherein another first gap is formed between the second light emitting unit and the fourth border;
wherein the light guide plate is located inside the frame and on a side of the flexible circuit board away from the first border, and each of the two spacers is located in a respective first gap; and
wherein inside the frame, two latches are respectively provided at a junction between the third border and the first border, and another junction between the fourth border and the first border, and wherein each of the two latches is located in a respective first gap and is bonded to one of the two spacers.

9. The display device according to claim 8,
wherein the light guide plate body comprises a non-smooth surface, a smooth surface, and a light incident end surface connected to the non-smooth surface and the smooth surface, the light incident end surface is a surface of the light guide plate body close to the first border, wherein the non-smooth surface is configured to comprise mesh-like structures;
wherein each of the spacers forms a first step structure with the light guide plate body, the non-smooth surface is a step surface of the first step structure, the light incident end surface is a step side surface of the first step structure, a first surface of the spacer is a step bottom surface of the first step structure, and a second surface of the spacer is away from the light incident end surface;
wherein each of the latches forms a second step structure, a step bottom surface of the second step structure is opposite to the first surface of the spacer, a step side surface of the second step structure is opposite to the second surface of the spacer, and there is a second gap between the step side surface of the second step structure and the second surface of the spacer; and
wherein in a direction perpendicular to the non-smooth surface, a step surface of each of the second step structures, among all the step surfaces of each of the second step structures, has the largest distance to the non-smooth surface.

10. The display device according to claim 9, wherein the step side surface of each of the second step structures is parallel to the second surface of the corresponding spacer, and an angle between the second surface of the corresponding spacer and a plane where the light incident end surface is located ranges from 30° to 60°.

11. The display device according to claim 9,
wherein a light shielding strip and a light shielding adhesive tape are provided on a side of the smooth surface away from the flexible circuit board, the light shielding strip being between the light guide plate body and the light shielding adhesive tape;
wherein an orthographic projection of the light incident end surface on the smooth surface is in an orthographic projection of the light shielding strip on the smooth surface; and
wherein an orthographic projection of the light shielding adhesive tape on the smooth surface covers orthographic projections of the plurality of light emitting units and the orthographic projection of the light shielding strip on the smooth surface; and
wherein the light shielding adhesive tape is fixed to the frame.

* * * * *